United States Patent
Raab et al.

Patent Number: 5,915,170
Date of Patent: Jun. 22, 1999

[54] MULTIPLE PART COMPLIANT INTERFACE FOR PACKAGING OF A SEMICONDUCTOR CHIP AND METHOD THEREFOR

[75] Inventors: Kurt Raab, San Jose; Thomas Pickett, Santa Clara; Thomas H. Di Stefano, Monte Sereno, all of Calif.

[73] Assignee: Tessera, Inc., San Jose, Calif.

[21] Appl. No.: 08/931,680

[22] Filed: Sep. 16, 1997

Related U.S. Application Data

[60] Continuation-in-part of application No. 08/842,313, Apr. 24, 1997, which is a division of application No. 08/365,699, Dec. 29, 1994, Pat. No. 5,659,952, which is a continuation-in-part of application No. 08/309,433, Sep. 20, 1994, abandoned

[60] Provisional application No. 60/038,859, Feb. 19, 1997.

[51] Int. Cl.$^6$ .......................... H01L 21/44; H01L 21/48; H01L 21/50

[52] U.S. Cl. ............................................. 438/118; 438/106

[58] Field of Search ............................................... 438/118

[56] References Cited

U.S. PATENT DOCUMENTS

| | | |
|---|---|---|
| 3,614,832 | 10/1971 | Chance et al. . |
| 3,680,037 | 7/1972 | Nellis et al. . |
| 3,795,037 | 3/1974 | Luttmer . |
| 3,862,790 | 1/1975 | Davies et al. . |
| 3,906,144 | 9/1975 | Wiley . |
| 4,017,495 | 4/1977 | Jaffe et al. . |
| 4,079,511 | 3/1978 | Grabbe . |
| 4,143,456 | 3/1979 | Inoue . |
| 4,163,072 | 7/1979 | Soos . |
| 4,190,855 | 2/1980 | Inoue . |
| 4,237,607 | 12/1980 | Ohao . |
| 4,300,153 | 11/1981 | Hayakawa et al. . |
| 4,381,602 | 5/1983 | McIver . |
| 4,396,936 | 8/1983 | McIver et al. . |

(List continued on next page.)

FOREIGN PATENT DOCUMENTS

| | | |
|---|---|---|
| 1-164054 | 12/1987 | Japan . |
| 1-253926 | 4/1988 | Japan . |
| 1-155633 | 6/1989 | Japan . |
| 1-278755 | 11/1989 | Japan . |
| 2-56941 | 2/1990 | Japan . |
| 4-91443 | 3/1992 | Japan . |
| 4-137641 | 5/1992 | Japan . |
| 1003-396-A | 8/1980 | U.S.S.R. . |
| 94/03036 | 2/1994 | WIPO . |

*Primary Examiner*—Kevin M. Picardat
*Assistant Examiner*—Deven Collins
*Attorney, Agent, or Firm*—Lerner, David, Littenberg, Krumholz & Mentlik, LLP

[57] ABSTRACT

A method of making a multiple part compliant interface for a microelectronic package including the steps of providing a first microelectronic element having electrically conductive parts, providing an array of curable elastomer support pads in contact with the first microelectronic element, curing the curable elastomer support pads while the support pads remain in contact with the first microelectronic element and providing an array of adhesive pads in contact with the support pads, whereby each adhesive pad is disposed over and in substantial alignment with one of the support pads. A second microelectronic element having electrically conductive parts is then assembled in contact with the array of adhesive pads by abutting the second microelectronic element against the array of adhesive pads and compressing the adhesive pads and support pads between the first and second microelectronic elements. The array of adhesive pads are then cured and the electrically conductive parts of the first and second microelectronic elements are interconnected. The array of support pads define channels running between any two adjacent support pads. A flowable curable elastomer encapsulant may be disposed within the channels after the electrically connecting step. Preferably, the support pads, adhesive pads and the encapsulant comprise substantially similar materials, such as silicone, in order to avoid problems associated with thermal cycling, such as air entrapment and/or voiding.

34 Claims, 4 Drawing Sheets

U.S. PATENT DOCUMENTS

| | | |
|---|---|---|
| 4,545,610 | 10/1985 | Lakritz et al. . |
| 4,604,644 | 8/1986 | Beckham et al. . |
| 4,642,889 | 2/1987 | Grabbe . |
| 4,710,798 | 12/1987 | Marcantonio . |
| 4,793,814 | 12/1988 | Zifcak et al. . |
| 4,857,483 | 8/1989 | Steffen et al. . |
| 4,955,132 | 9/1990 | Ozawa . |
| 5,110,388 | 5/1992 | Komiyama et al. . |
| 5,130,781 | 7/1992 | Kovac et al. . |
| 5,140,404 | 8/1992 | Fogal et al. . |
| 5,148,265 | 9/1992 | Khandros et al. . |
| 5,148,266 | 9/1992 | Khandros et al. . |
| 5,194,930 | 3/1993 | Papathomas et al. . |
| 5,203,076 | 4/1993 | Banerji et al. . |
| 5,225,966 | 7/1993 | Basavanhally et al. . |
| 5,249,101 | 9/1993 | Frey et al. . |
| 5,265,329 | 11/1993 | Jones et al. . |
| 5,272,113 | 12/1993 | Quinn ........ 438/118 |
| 5,316,788 | 5/1994 | Dibble et al. . |
| 5,350,947 | 9/1994 | Takekawa et al. . |
| 5,355,283 | 10/1994 | Marrs et al. . |
| 5,394,009 | 2/1995 | Loo . |
| 5,431,571 | 7/1995 | Hanrahan et al. . |
| 5,477,611 | 12/1995 | Sweis et al. . |
| 5,548,091 | 8/1996 | DiStefano et al. . |
| 5,563,445 | 10/1996 | Iijima et al. . |
| 5,659,952 | 8/1997 | Kovacs et al. . |
| 5,672,542 | 9/1997 | Schutebutt et al. . |
| 5,678,301 | 10/1997 | Gochnour et al. ........ 438/118 |

MULTIPLE PART COMPLIANT INTERFACE FOR PACKAGING OF A SEMICONDUCTOR CHIP AND METHOD THEREFOR

CROSS REFERENCE TO RELATED APPLICATIONS

This application claims benefit of United States Provisional Patent Application Serial No. 60/038,859 filed Feb. 19, 1997, the disclosure of which is incorporated by reference herein. This application is a continuation-in part of application Ser. No. 08/842,313, filed Apr. 24, 1997, which is in turn a division of Ser. No. 08/365,699 filed Dec. 29, 1994 now U.S. Pat. No. 5,659,952, which in turn is a continuation-in-part of Ser. No. 08/309,433, filed Sept. 20, 1994 and now abandoned.

FIELD OF THE INVENTION

The present invention relates, generally, to the field of microelectronic packaging, and more particularly relates to provision of a compliant interface between microelectronic elements such as a semiconductor chip and substrate.

BACKGROUND OF THE INVENTION

Designers and manufacturers of electronic devices are continually searching for ways to reduce the size of electronic components. Some recent developments involve the use of solder connections for electrically interconnecting semiconductor chips to printed circuit boards ("PCB") in order to use the space on the PCB more efficiently. Solder connections have proven to be somewhat effective; however, the differences in thermal expansion and contraction ("thermal mismatch") between the semiconductor chip and the PCB places a great amount of stress on the solder and may adversely effect the integrity of the numerous solder bonds required to make an electrical connection. In addition, warpage of either the semiconductor chip or the PCB may have a negative effect on the integrity of the solder connections.

Several inventions, commonly assigned to the assignee of the present invention, deal effectively with the thermal mismatch problem. For example, one embodiment of U.S. Pat. No. 5,148,266 discloses a semiconductor chip which can be connected to a substrate using a sheet-like, and preferably flexible, interposer which overlies the top, contact-bearing surface of the chip. The interposer has terminals and includes flexible leads for interconnecting the contacts on the chip with the terminals on the interposer so that the terminals are movable relative to the contacts on the chip which provides excellent resistance to differential expansion of the chip relative to the substrate caused by thermal cycling. A compliant layer may be disposed between the interposer and the chip.

Commonly assigned U.S. Pat. No. 5,477,611, the disclosure of which is incorporated herein by reference, discloses a method for creating an interface between a chip and chip carrier, including spacing the chip a given distance above the chip carrier, and introducing a liquid in the gap between the chip and carrier. Preferably, the liquid is a curable material which is cured into a resilient layer such as an elastomer after its introduction into the gap. In one preferred embodiment, the terminals on a chip carrier are planarized or otherwise vertically positioned by deforming the terminals into set vertical locations with a plate, and a liquid is then cured between the chip carrier and chip.

Commonly assigned U.S. Pat. No. 5,548,091 describes other methods of bonding compliant elements to the chip and support structure using adhesives. In certain preferred methods according to the '091 patent, a support structure, such as a dielectric film, is provided with a prefabricated compliant layer which in turn has an adhesive on its surface remote from the dielectric film. The semiconductor chip is placed in contact with the adhesive, and the adhesive is activated to bond the chip to the compliant layer. The adhesive may be provided in a non-uniform layer to facilitate release of air during the bonding process and thus prevent void formation.

Copending, commonly assigned U.S. patent application Ser. No. 08/365,699 entitled "Compliant Interface for a Semiconductor Chip and Method Therefor" filed Dec. 29, 1994, the disclosure of which is incorporated herein by reference, discloses a method of fabricating a compliant interface for a semiconductor chip. In certain preferred methods according to the '699 application, a first support structure is provided and a resilient element, such as a plurality of compliant pads, is attached to a first surface of the first support structure. The plurality of compliant pads comprise an array of pads, whereby any two adjacent pads in the array define a channel therebetween. Attaching the array of compliant pads to the first support structure may be accomplished in a number of different ways. In one embodiment, a stencil mask having a plurality of holes extending therethrough is placed on top of the first surface of the support structure. The holes in the mask are then filled with a curable liquid, such as silicone. After the mask has been removed, the curable liquid is at least partially cured to form an elastomer including an array of compliant pads having channels between adjacent pads.

In a further preferred embodiment of the '699 application, the assembly including the plurality of compliant pads is used with a second support structure, such as a semiconductor chip having a plurality of contacts on a first surface. The first surface of the chip is abutted against the plurality of compliant pads and the contacts are electrically connected to a corresponding plurality of terminals on the support structure. The array of compliant pads assures coplanarity between the chip and the support structure. A compliant filler, such as a curable liquid, is allowed to flow into the channels between the chip and the support structure and around the compliant pads while the chip and support structure are held in place. The filler may then be cured to form a substantially uniform, planar, compliant layer between the chip and the support structure which effectively accommodates for the thermal coefficient of expansion mismatch between the chip and a supporting substrate.

Copending commonly assigned U.S. patent application Ser. No. 08/877,379 entitled "Bondable Compliant Pads for Packaging of a Semiconductor Chip and Method Therefor" filed Jun. 10, 1997 and U.S. Provisional Application Serial No. 60/019,475 filed Jun. 10, 1996, the disclosures of which are incorporated herein by reference, disclose a method of fabricating a compliant interface for a semi-conductor chip comprising a resilient element having one or more intermediary layers capable of being wetted by an adhesive. In one preferred embodiment according to the disclosure, a layer of fibrous material, such as paper, is provided at one or more surface regions of the curable elastomer and the elastomer is then cured while in contact with the paper. In another embodiment, a fibrous mesh or pad is provided at one or more surface regions of a curable elastomer. In further embodiments, a fibrous material is mixed with or blended into a curable elastomer and the elastomer is cured so that at least some of the fibrous material protrudes from the surface regions thereof. The resilient element provided by the disclosed methods can be used with an adhesive to bond the resilient element to one or more microelectronic elements. After curing of the adhesive, the adhesive engages and/or intermeshes with the one or more intermediary layers.

Despite the positive results of the aforementioned commonly owned inventions, the disclosures of which are incorporated herein by reference, still further improvements would be desirable.

SUMMARY OF THE INVENTION

One aspect of the present invention provides a method of making a compliant interface for microelectronic assemblies. A method in accordance with this aspect of the invention includes the steps of providing a first microelectronic element having electrically conductive parts, providing an array of curable elastomer support pads in contact with the first microelectronic element, curing the curable elastomer support pads while the support pads remain in contact with the first microelectronic element and providing an array of adhesive pads in contact with the cured elastomer support pads whereby each adhesive pad is disposed over and in substantial alignment with one of the support pads. A second microelectronic element having electrically conductive parts is then assembled in contact with the adhesive pads by abutting the second microelectronic element against the adhesive pads and compressing the adhesive pads and the support pads between the microelectronic elements. The adhesive pads are at least partially cured during the assembly step. After the assembly step, a curable elastomer encapsulant having a liquid or semi-liquid form is allowed to flow between the support pads and the encapsulant is then typically cured. For example, the first microelectronic element may be a flexible dielectric interposer with terminals and leads thereon, whereas the second microelectronic element may include one or more semiconductor chips having contacts thereon. The leads may be bonded to the contacts so as to connect the terminals with the contacts. Preferably, the leads are bonded to the contacts before the encapsulant is disposed between the support pads.

The providing an array of curable elastomer support pads step preferably includes the steps of providing a stencil having a plurality of holes atop the first microelectronic element, filling the holes in the stencil with a curable material, removing the stencil and curing the array of support pads while the support pads remain in contact with the first microelectronic element. In accordance with one embodiment, a curable silicone elastomer is removed from storage and allowed to thaw at room temperature. A first stencil having an array of holes formed therein is then placed atop the first microelectronic element and is used to print the curable elastomer onto the first microelectronic element. The curable elastomer is screened into the holes and forms an array or matrix of support pads preferably having a generally dome shaped appearance, with the apex of each support pad being at the top center region thereof. The first stencil is then removed and the pads typically flow slightly so that the eventual diameter of the pads is slightly larger than the diameter of the holes in the first stencil. The array of support pads are then subjected to a curing process to form fully cured support pads. The support pads define open spaces or channels which run between any two adjacent pads within the array. A storage liner may be provided over the cured support pads in order to prevent the support pads from becoming contaminated while the support pads are held in storage.

The method of making a multiple part compliant interface also includes the step of providing an array of adhesive pads over and substantially in alignment with said array of support pads. In accordance with this step, a second stencil having an array of holes therein is aligned over the cured support pads so that the holes in the second stencil are co-extensive with and/or aligned over the support pads. The diameter of the holes in the second stencil is generally smaller than the diameter of the holes in the first stencil; however, the second stencil is generally thicker than the first stencil. An adhesive material, such as a curable elastomer, is then stencil printed over the support pads so that each support pad has an adhesive pad formed or disposed thereon. The viscosity of the adhesive pads is generally greater than the viscosity of the support pads due to the introduction of a filler material into the adhesive pad material, such as fumed silica. The adhesive pads may be stencil printed over the support pads either immediately after the support pads have been cured on the dielectric film or at a later time period, after the support pads have been removed from storage.

After the array of adhesive pads have been stencil printed onto the top of the support pads, the base of each adhesive pad will substantially conform to the dome-shaped top surface of the support pad and the top of each adhesive pad will be generally concave or cup-shaped so that the top perimeter region of the adhesive pad is higher than the top center region of the adhesive pad. The combined structure of each support pad and the adhesive pad disposed thereover is hereinafter referred to as a support pad/adhesive pad subassembly. Prior to assembly of the second microelectronic element with the support pad/adhesive pad subassemblies, the adhesive pads are generally not in contact with the first microelectronic element. This is due, in part, to the fact that the adhesive pads have a higher viscosity than the support pads and thus the adhesive pads tend to sit atop the array of support pads and not flow down the sides of the support pads. During the assembly step, the second microelectronic element is aligned with and abutted against the array of adhesive pads whereby the support pad/adhesive pad subassemblies are compressed between the first and second microelectronic elements. In embodiments where the adhesive may be partially cured, the second microelectronic element may be heated prior to the assembly step so that the array of adhesive pads are at least partially cured during the assembling step. After being compressed together by the microelectronic elements, each adhesive pad/support pad subassembly has a generally column-like shape whereby the adhesive pad material covers most, if not all of the top surface of the support pad. The support pad/adhesive pad subassemblies define channels which run therebetween.

After the second microelectronic element has been assembled to the first microelectronic element, the leads are bonded to the contacts to form an electrical interconnection therebetween. A compliant filler material, such as a flowable, curable elastomer encapsulant is allowed to flow within the channels. After the curable elastomer encapsulant has been allowed to flow within the channels, the elastomer is subjected to a curing process, such as by using heat or other curing agent. In certain preferred embodiments, the encapsulant will constitute the bulk of the multiple part compliant interface because the array of support pads/ adhesive pad subassemblies comprise only about 15–35% of the area between the first and second microelectronic elements. Preferably the support pads, adhesive pads and curable elastomer encapsulant comprise materials having substantially similar coefficients of thermal expansion. In other words, it is preferable that the compliant interface comprising the support pads, adhesive pads and encapsulant be a substantially homogenous structure in order to avoid thermal mismatch problems and so that voids do not develop between the compliant interface and the microelectronic elements. However, the specific properties of the support pads and adhesive pads are not as critical as the properties of the encapsulant so that the support pads and adhesive pads may comprise a more diverse assembly of materials, such as silicones and epoxies, than is possible with the encapsulant.

The present invention incorporates the realization that semiconductor chips can malfunction when air pockets or voids are present in the semiconductor chip package. The voids typically include entrapped air and/or moisture which expands when the package heats up while in operation. Expansion of the trapped air and/or moisture creates an undue amount of stress on the package which could result in damage to the package or chip such as cracking or delamination of the package elements. A crack in a semiconductor package is frequently a fatal defect. The preferred embodiments of forming multiple part compliant interfaces according to the various processes of the present invention greatly reduce the likelihood of void formation. First, it is unlikely that voids will form between the support pads and the first microelectronic element because the pads are flowable when they are provided on the first microelectronic element and thus the base of the support pads will generally conform to the surface of the first microelectronic element. In addition, during the compression step, the adhesive pads are malleable so that they will generally conform to the top of the support pads and the abutting face of the second microelectronic element. Finally, the curable encapsulant flows freely in the channels between the support pad/adhesive pad subassemblies to displace any air remaining in the channels. Thus, after the encapsulant has been disposed within the channels and the pads and encapsulant have been cured, there should be no undesirable voids present within the microelectronic package.

The present invention also incorporates the realization that when providing a void-free compliant interface for a semiconductor package, in many instances, it is preferable to use a plurality or array of smaller compliant pads rather than using one large, unitary pad per chip attachment site. This is especially true when the compliant pad material is applied to the dielectric film in a curable liquid form through a stenciling operation. The larger unitary pad also tends to have a cup-shaped center region because of the action of the squeegee along the opening of the stencil. Moreover, when the stencil is removed from the unitary pad, the edges of the pad tend to be lifted up which causes further non-planarity. This non-planarity of the larger, unitary pad tends to encourage air entrapment and/or voiding problems at the interface of the pad and the face of the microelectronic elements which could result in air entrapment and/or poor adhesion between the pad and microelectronic elements. In contrast, when using an array of compliant pads, the pads may be reliably and repeatedly stencil printed because the surface tension of the smaller deposits of liquid material tends to more uniformly control the shape and height of the smaller pads. Thus, a more consistent production of an array of smaller pads allows the tops of the pads to be more planer over the entire array than is possible with a unitary pad. In addition, the use of an array of pads reduces the volume of silicone elastomer present on the dielectric film, thereby minimizing the risk of silicone creeping onto the components (i.e., leads) for electrically connecting the microelectronic elements together. It is generally known that the bond between the electrical components of microelectronic elements will be weakened if the silicone in the silicone elastomer comes in contact with the electrical components before the bonding operation. Thus, it is desirable to reduce any likelihood that the leads will be exposed to silicone.

The support pads should be printed as close as possible to the edge of the first microelectronic element without contacting the leads in order to provide support and/or structural integrity for the leads during the bonding process. Moreover, the height of the spacer pad/adhesive pad subassemblies can be controlled by altering the viscosity of the pads and the size of the pads so that there exists a preferred standoff distance between the first and second microelectronic elements. The utilization of a preferred standoff distance provides for more reliable shaping and bonding of the flexible leads as disclosed in U.S. Pat. No. 5,398,863 which is incorporated herein by reference.

In another embodiment of a method of making the compliant interface described above, the array of adhesive pads include a pressure sensitive adhesive or a dry die attach material. In this embodiment, a mass of a curable material, such as a curable silicone elastomer or an epoxy, is screened or stencil printed onto the first microelectronic element to form an array of curable support pads. The adhesive is then stencil printed over the curable support pads and remains in contact with the support pads while the support pads are fully cured. The adhesive comprises an array of pads which are coextensive with the array of support pads so that each support pad has an associated adhesive pad formed thereon. A storage liner may also be provided over the adhesive to protect the assembly from contamination. In a further embodiment, the adhesive is provided over the support pads through a dispensing needle. In another embodiment, the adhesive is not provided over the support pads, but is provided in contact with the front face of the second microelectronic element prior to the assembling step.

The foregoing and other objects and advantages of the present invention will be better understood from the following detailed description of a preferred embodiment taken together with the attached figures.

DETAILED DESCRIPTION OF A PREFERRED EMBODIMENT

Figure 1:
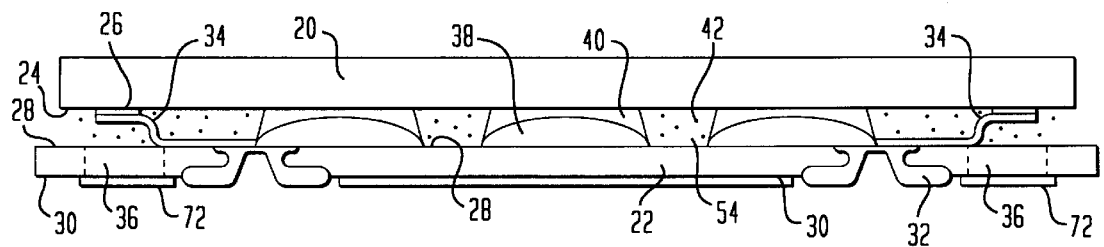
FIG. 1 shows a side view of a microelectronic package including a multiple part compliant interface, according to one embodiment of the present invention.

One embodiment of the present invention provides a method of making a multiple part compliant interface for a microelectronic package. As shown in FIG. 1, a semiconductor chip 20 and an interposer 22 having electrically conductive parts are juxtaposed with one another before being bonded together to form a semiconductor chip package. The semiconductor chip 20 has a generally planar front face 24 including electrical parts or contacts 26 formed on peripheral regions of the front face 24. In the particular chip 20 shown, the contacts 26 are arranged in rows (not shown) which are adjacent, and run parallel to, each edge of the chip 20. The contacts 26 in each row are spaced at very close intervals, typically about 100 to about 250 micrometers center-to-center. This center-to-center spacing is adequate for high input/output ("I/O") count chips used with wire bonding or tape automated bonding systems.

The interposer 22 is a flexible sheet-like dielectric film having a first surface 28 and a second surface 30. The dielectric film 22 is preferably formed from a polymeric material, such as KAPTON™ (E) available from DuPont Chemical Corp., having a typical thickness between 25 microns and 75 microns. The dielectric film 22 has conductive terminals 32 on the second surface 30 thereof, electrical parts or leads 34 extending from the terminals 32 for electrically connecting the terminals 32 to the semiconductor chip 20, and bond windows 36 for accessing the leads 34 while bonding the leads 34 with the semiconductor chip 20. The chip 20 and the dielectric film are assembled together to provide a semiconductor chip package which includes a multiple part compliant interface comprising an array of support pads 38, an array of adhesive pads 40 which are coextensive and substantially aligned with the array of support pads 38 and a compliant filler or encapsulant 42 which fills spaces or channels between the support pads 38 and the adhesive pads 40.

Figure 2:
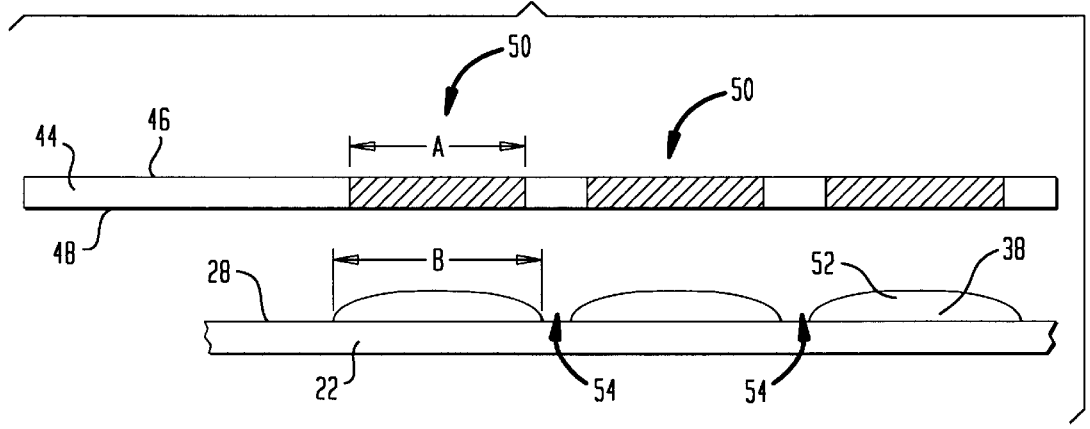
FIG. 2 shows a side view of an array of support pads being stencil printed onto a microelectronic element, according to the present invention.

Referring to FIG. 2, in a method according to one embodiment of the present invention an array of support pads 38 are provided in contact with the dielectric film 22. The array of support pads 38 are preferably provided by forming a mass of a curable liquid elastomer material, such as the Dow Corning silicone elastomer 6910 on the first surface 28 of the dielectric film 22. The exact formulation of the curable liquid elastomer may vary slightly based upon such factors as the desired mechanical standoff distance between the microelectronic elements, the desired spacing between the support pads 38, the number of support pads 38 on the dielectric film 22, and the structure of the microelectronic package. The curable elastomer is provided on the dielectric film 22 by using a stencil mask 44 having top and bottom surfaces 46 and 48 and further having a plurality of holes 50 extending there through. The bottom surface 48 of the stencil 44 is placed adjacent the first surface 28 of the dielectric film 22 and the curable elastomer is wiped or screened across the first surface 28 of the stencil 44 so that the curable elastomer is deposited into each of the holes 50.

In one preferred embodiment, the curable elastomer is deposited through a first stencil having a thickness of approximately 75–125 microns and the first stencil has an array of apertures having a diameter of approximately 400–500 microns. The desired viscosity of the support pads 38 is preferably predetermined such that the resultant support pads 38 are dome shaped and do not dish or cup at the top center region 52 of the pads 38. After the pads 38 are formed on the dielectric film 22 and the stencil 44 is removed, the support pads 38 flow slightly before curing to form an array of domed support pads 38 having a predetermined diameter and height. Referring to FIG. 2, immediately after the stencil 44 is removed, the diameter of the pad equals the diameter of the holes 50 in the stencil 44, as designated by reference letter "A"; however, each pad flows slightly after removal of the stencil before curing to reach a diameter designated by reference letter "B". The base of the pads 38 generally conform to the shape of the first surface 28 of the dielectric film 22 as the pads 38 flow outward so that there are no voids between the base of the pads 38 and the dielectric film 22. The support pads 38 are then cured using heat, ultraviolet light or another form of energy. In the case of the Dow 6910 elastomer, the curable elastomer is typically heated to approximately 150° C. for 40 minutes to fully cure the support pads 38. In one preferred embodiment, the dome-shaped support pads have a diameter of approximately 500–600 microns, a height of approximately 75–125 microns and a center-to-center distance between adjacent support pads of between 700–800 microns.

Figure 3:
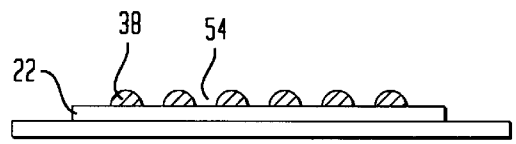
FIG. 3 shows a side view of an array of support pads formed on a first microelectronic element, according to the present invention.
Figure 4:
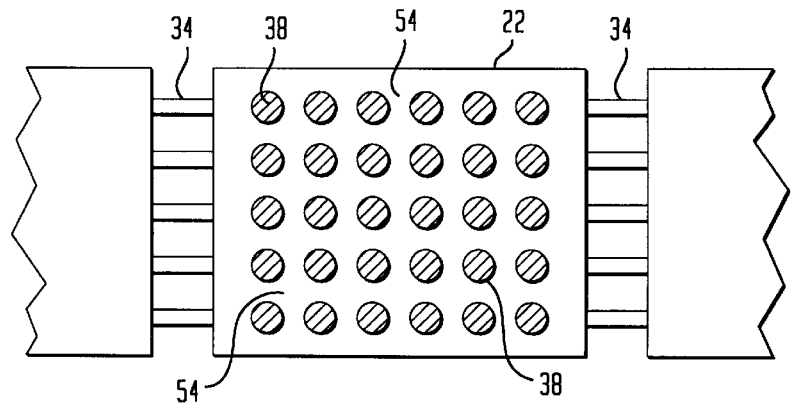
FIG. 4 shows a top view of the array of support pads shown in FIG. 3.

Referring to FIGS. 3 and 4, the array of support pads 38 define spaces or channels 54 which run between any two adjacent pads 38 within the array. As will be discussed in more detail below, after the semiconductor chip package has been assembled, a compliant filler or encapsulant is allowed to flow within the channels 54 in order to provide the package with a compliant interface and to protect the flexible leads 34 interconnecting the dielectric film 22 and the semiconductor chip 20, as described in U.S. patent application Ser. No. 08/726,697 filed Oct. 7, 1996, the disclosure of which is incorporated herein by reference. It is preferable to have as many support pads 38 as possible on the dielectric film 22, however, the channels 54 must be sufficiently wide so the encapsulant is able to flow freely through the channels 54.

Figure 5A:
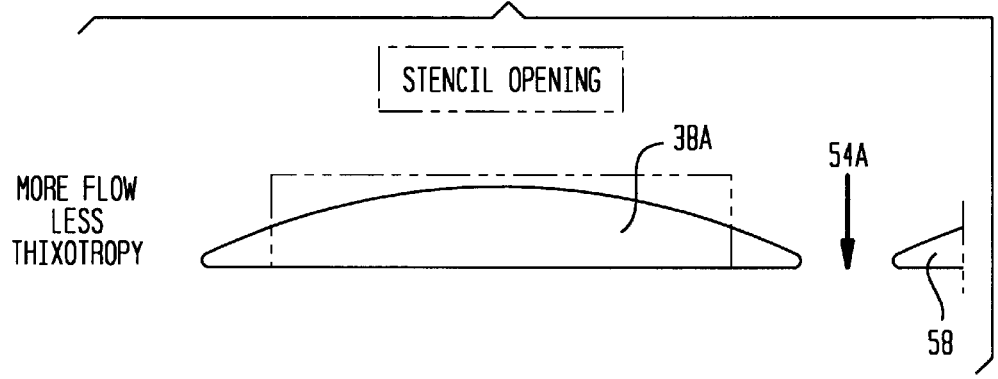
FIGS. 5A–5E show a side view of various preferred and non-preferred embodiments of support pads, according to the present invention.
Figure 5B:
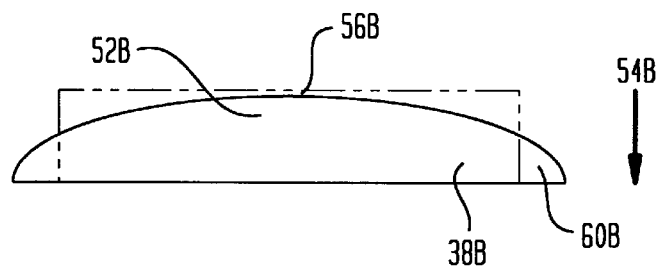
Figure 5C:
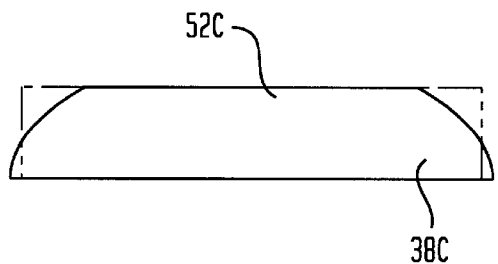
Figure 5D:
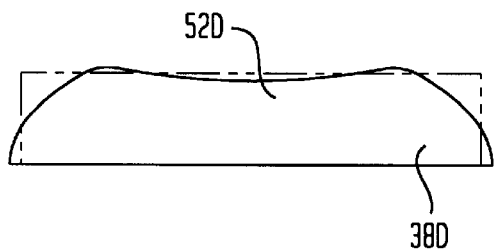
Figure 5E:
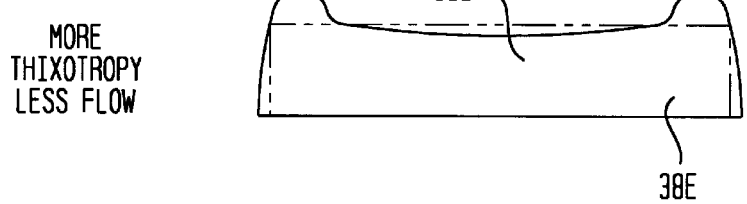

FIGS. 5A through 5E show examples of preferred and non-preferred shapes for the support pads 38 after the pads have been fully cured. The final shape of the support pads 38 is largely determined by the viscosity of the curable elastomer material used to print the pads. The exact viscosity may vary based upon such factors as the number of support pads 38 printed onto the dielectric film, the structure of the microelectronics package being assembled, and the desired standoff distance between the microelectronic elements. Preferably, the support pads 38 should have a generally dome shaped appearance with an apex 56 at the top center region 52 of each pad 38. Certain undesirable conditions may arise if the viscosity of the pads 38 is too high or too low. For example, referring to FIG. 5A, if the viscosity is too low, the curable elastomer will flow too much after the stenciling operation and thus the pads 38A will not have the desired height or diameter. One problem which may result from this situation is that the channels 54A between neighboring pads 38A will be restricted because the peripheral region of support pad 38A will be too close to neighboring pad 58. As a result, the compliant filler or encapsulant will not be able to flow freely and completely through channel 54A which could result in air entrapment or void formation between the microelectronic elements. On the other hand, referring to FIGS. 5D and 5E, if the viscosity is too high, the pads 38D, 38E will have a concave or cup-like shape at the top center region 52D, 52E of the pads which increases the likelihood that voids or air gaps will form during assembly of the semiconductor chip 20 to the dielectric film 22. FIGS. 5B and 5C show pads 38B, 38C having preferred shapes due to the curable elastomer material having a proper viscosity. The embodiment in Fig. 5B is preferred because the pad 38B is dome-shaped and its peripheral region 60B is sufficiently distant from neighboring pads so that the channels 54B between the pads 38B will not be restricted. The embodiment in FIG. 5C is preferred because there is no cupping at the top center region 52C of the pad 38C and because the flat top provides a preferred surface for supporting the adhesive pads.

The basic function of the support pads is to provide mechanical standoff and co-planarity between the semiconductor chip and the dielectric film. For these reasons the support pads may comprise a wide range of materials, such as silicones and epoxies; however, preferably the support pads should comprise a low volatility material which will not contaminate the electrical components of the microelectronic elements once the support pads are in contact with the microelectronic elements, i.e., the leads on the dielectric film. Although some cured epoxies may be slightly more rigid than cured silicone elastomers, this will not adversely affect the flexibility or compliancy of the compliant interface because, as is evident in FIG. 4, the support pads 38 generally encompass only 15 to 35% of the volume between the microelectronic elements, so that most of the area between the microelectronic elements comprises the channels 54. Generally, the number of support pads 38 required will be reduced as the microelectronic element bearing the support pads becomes more rigid because fewer support pads will be required to provide structural integrity to the microelectronic package during assembly and bonding. Preferably, however, the pads 38 comprise a compliant material and have a volumetric coverage which is as high as possible while still allowing a suitable compliant filler or encapsulant to flow between the adjacent pads 38.

Figure 9:
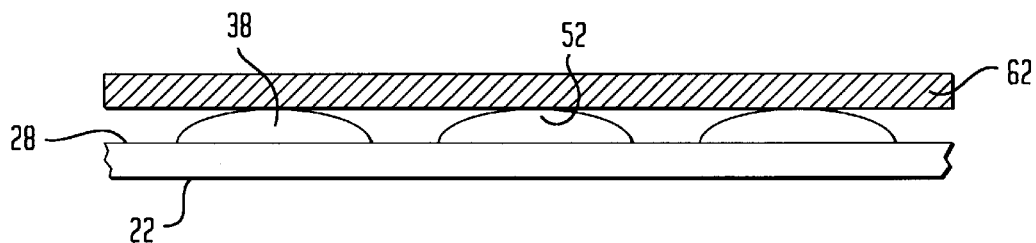
FIG. 9 shows the array of support pads shown in FIG. 3 including a storage liner provided over the support pads, according to another embodiment of the present invention.

Referring to FIG. 9, after the array of support pads 38 are fully cured, they may be placed in storage until they are required for assembling a microelectronic package. The exact storage conditions will depend upon factors such as how long the pads 38 will be in storage and the specific material composition of the curable elastomer used to fabricate the pads. In one preferred embodiment, a storage liner 62 is provided over the top 52 of the support pads 38 to protect the pads from contamination and so that the pads 38 may be easily handled. In addition, a surface treatment, such as a synthetic fluorine-containing resin sold under the trademark TEFLON® (not shown), may be disposed between the storage liner and the array of support pads 38 to reduce the level of tack therebetween. It is contemplated that the storage liner 62 may be placed over the pads 38 either before or after curing. The storage liner 62 may be removed from the support pads 38 whenever the pads are needed for assembling a microelectronic package.

Figure 6:
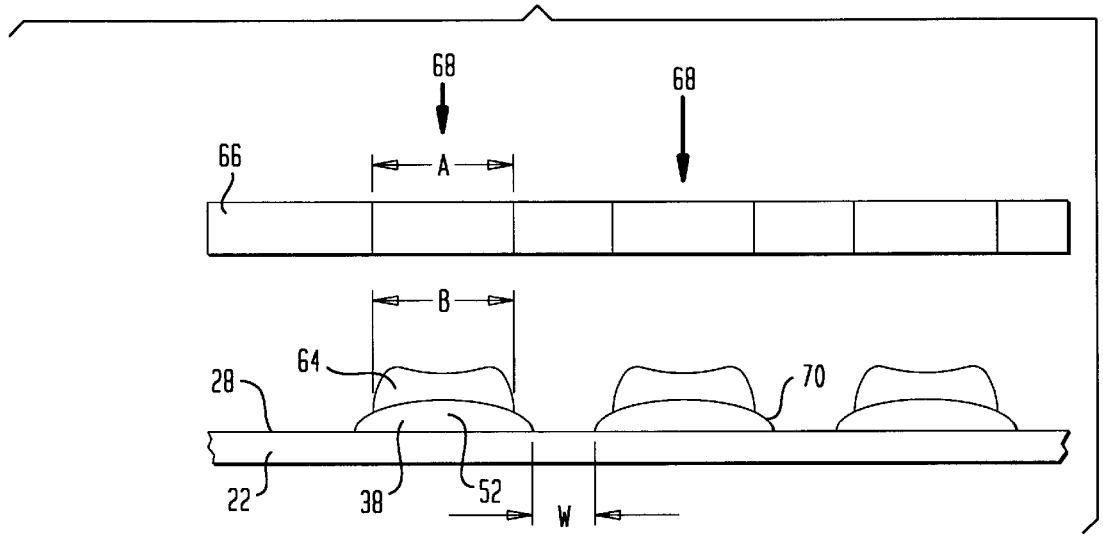
FIG. 6 shows a side view of an array of adhesive pads being stencil printed over the array of support pads shown in FIG. 3, according to the present invention.

Referring to FIG. 6, after the array of support pads 38 have been fully cured, or after the pads 38 have been removed from storage, the pads 38 are prepared for assembly with a microelectronic package by providing an array of adhesive pads 64 over the top 52 of the support pads 38, such as by using a stencil printing operation. The array of adhesive pads 64 are preferably provided by forming a mass of a curable liquid elastomer material, such as the Dow Corning silicone elastomer 6910, over the top of each support pad 38. The array of adhesive pads are preferably formed coextensive with and in alignment with the array of support pads 64 so that each adhesive pad 64 is centered over the top 52 of one of the support pads 38. A filler material, such as fumed silica, is introduced into the curable liquid elastomer material so that the adhesive pads have a greater viscosity than the support pads. For this operation, a second stencil 66 having a thickness of approximately 100–150 microns and including an array of apertures 68 approximately 350–450 microns in diameter is juxtaposed with the array of cured support pads 38 such that a curable elastomer may be deposited on top of each support pad 38. After the second stencil 66 is removed, each adhesive pad 64 has a height of approximately 100–150 microns and a diameter of approximately 350–450 microns. Preferably, the height of each adhesive pad 64 is greater that the height of the support pad 38 associated therewith and the diameter of the adhesive pad 64 is less than the diameter of the support pad 38. Unlike the support pads 38, the dimensions of the adhesive pads 64 remain generally the same after the stenciling operation because, as mentioned above, the adhesive pad material has a greater viscosity than that of the support pads 38. This thicker consistency allows the adhesive pads 64 to remain on top of the support pads 38 after the stencil operation and not "slide down" the side walls 70 of the support pads 38. However, the adhesive pad material should not be so thick that it does not flow well when the front face of a semiconductor chip or die is compressed against the adhesive pads 64. Moreover, the side walls 70 of the support pads 38 themselves should not be so steep that the adhesive pads 64 cannot stay on top of the support pads 38 (e.g., in FIGS. 5D and 5E the side walls of the pads are too steep such that an adhesive pad would tend to slide off the support pad). The support pad/adhesive pad subassemblies may then be stored until they are required for assembling a microelectronic package. Because the adhesive pads 64 are stored in a partially-cured or uncured state, the maximum preferred storage period for the support pad/adhesive pad subassembly should not exceed two days or 48 hours. If a longer shelf life is desired, the support pads 38 may be stored separately in a fully cured state, and the adhesive pads 64 may be provided over the support pads 38 shortly before final assembly of a microelectronic package (e.g., less than 48 hours).

Figure 7:
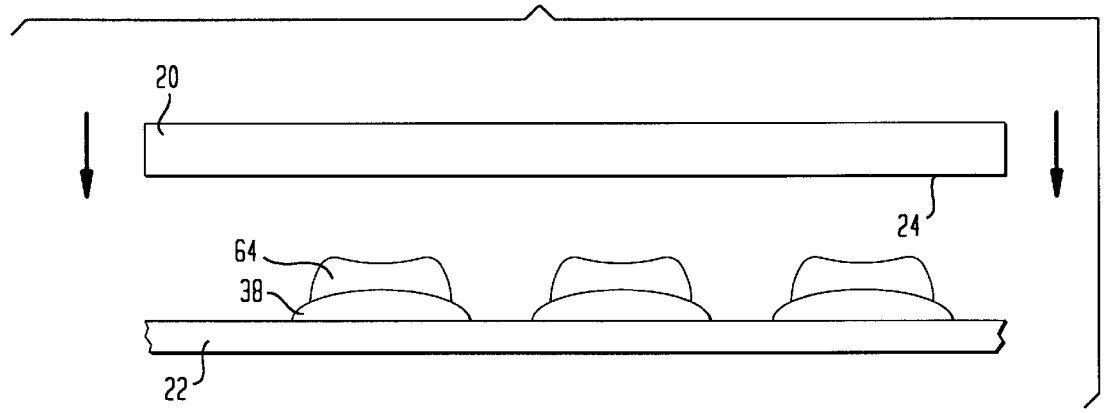
FIG. 7 shows the array of adhesive pads shown in FIG. 6 immediately prior to being assembled with a second microelectronic element, according to the present invention.
Figure 8:
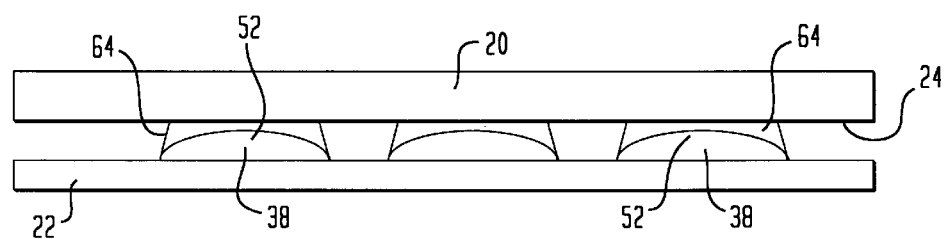
FIG. 8, shows the array of adhesive pads shown in FIG. 7 after being assembled with the second microelectronic element, according to the present invention.

As shown in FIGS. 7 and 8, after the array of adhesive pads 64 has been stencil printed over the array of support pads 38, a semiconductor chip 20 may be assembled to the support pad/adhesive pad subassembly. Preferably, the support pads and the adhesive pads comprise substantially the same material, such as a curable silicone elastomer. The use of a substantially similar composition provides a homogenous structure which minimizes problems associated with thermal cycling or thermal mismatch. In one preferred embodiment, the semiconductor chip 20 is first heated before the assembling step using a standard heated collet on a machine used to attach the semiconductor chip 20 to the dielectric film 22 so that the adhesive pads 64 may partially cure at the time of chip placement, thereby creating better adherence between the chip 20 and the support pad/adhesive pad subassemblies. Preferably, the step of aligning, abutting and compressing the front face 24 of the semi-conductor chip 20 against the array of adhesive pads 64 allows the adhesive pad material to flow slightly such that it covers or encapsulates most, if not all, of the exposed top surface of the support pads 38. The volume of adhesive pad material that is pressed upon during the chip attach operation is fairly small and thus each deposit of adhesive pad material is allowed to spread out over at least a portion of the surface of its associated support pad 38, unimpeded by the adhesive pads 64 on adjacent support pads 38. This unimpeded flow provides a more void-free interface between the support pad/adhesive pad subassembly and the front face 24 of the semiconductor chip 20. After the adhesive pad material has been initially at least partially cured by exposure to the heated chip 20, the adhesive pad material may be further cured so that it better adheres to the chip 20 and it is no longer flowable in response to external forces. As shown in FIG. 8, in preferred embodiments the resulting support pad/adhesive pad subassemblies are void-free, have a generally column-like shape and are approximately 100–150 microns thick and 500–600 microns in diameter. The channels 54 running between adjacent support pad/adhesive pad subassemblies are between 75–100 microns wide. In other words, the distance W (FIG. 6) between the outer peripheries of adjacent support pad/adhesive pad subassemblies is between 75–100 microns.

Referring to FIG. 1, once the semiconductor chip 20 has been assembled with the adhesive pad/support pad subassemblies and after the adhesive pads 64 are cured, each terminal 32 on the dielectric film 22 is connected with a contact 26 on the semiconductor chip 20 by bonding the leads 34 to the contacts 26. The terminals 32 and leads 34 may be formed from substantially any electrically conductive material, but preferably are formed from metallic material such as copper and copper alloys, noble metals and noble metal alloys and are typically fabricated by conventional photolithographic and etching or deposition techniques. The leads 34 are electrically connected to the contacts 26 on the chip 20 by a conventional wire bonding operation, or by a bonding operation as shown in U.S. Pat. Nos. 5,398,863; 5,390,844; 5,536,909 and 5,491,302. Preferably, the support pads 38 are as close to the edge of the dielectric film 22 as possible, without contacting the leads 34, in order to provide structural integrity during the bonding step.

In the next stage of the process, a low elastic modulus dielectric encapsulant or compliant filler material 42, such as a liquid silicone elastomer or other curable liquid elastomer, is allowed to flow between the dielectric film 22 and the front face 24 of the chip 20. In one preferred embodiment, the encapsulant is a Newtonian fluid such as the Dow Corning silicone elastomer 6810. The encapsulant material 42 flows within the channels 54 running between the support pads 38 and around the leads 34 while the semiconductor chip 20 and the dielectric film 22 are compressed together or held in place. A mask 72 may be placed over the bond windows 36 to prevent the encapsulant 42 from flowing through the bond windows 36 during the encapsulation process. The encapsulant 42 is preferably substantially similar to the curable elastomer material used to form the support pads 38 and the adhesive pads 64 in order to provide a compliant interface having a more homogenous structure which reduces problems associated with thermal mismatch.

After the encapsulant 42 has been allowed to flow within the channels 54, the encapsulant 42 is cured by energy such as heat, ultraviolet light or other radiant energy to form a substantially uniform, planar, compliant layer between the semiconductor chip 20 and the dielectric film 22. Because the silicone elastomer encapsulant 42 is applied after the bonding step, there is no risk of the silicone coming in contact with the leads 34 or contacts 26 before bonding, which could diminish the strength of the bonds. In certain preferred embodiments, many microelectronic packages are simultaneously manufactured using the processes described above. These packages are then separated from one another using a standard dicing technique. The individual semiconductor chip packages may then be attached to a supporting substrate, such as a standard printed circuit board ("FR-4 circuit board").

Figure 10:
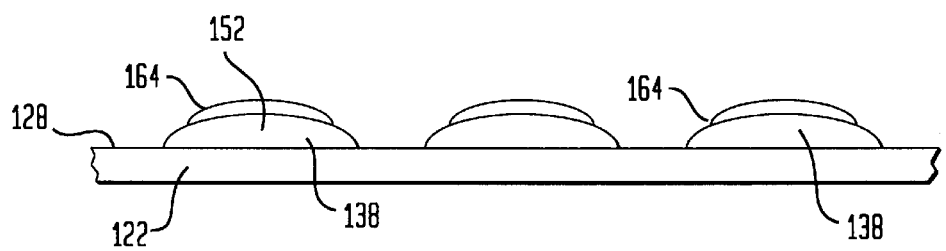
FIG. 10 shows the array of support pads shown in FIG. 3 including an array of adhesive pads provided over the array of support pads, according to another embodiment of the present invention.

Referring to FIG. 10, a method in accordance with another preferred embodiment provides a multiple part compliant interface which comprises an array of support pads 138 and a pressure sensitive adhesive or a dry die attach material 164, such as Dow Corning 7010, formed over the array of support pads. In accordance with this embodiment, a mass of a curable liquid elastomer or epoxy is stencil printed onto a first surface 128 of a dielectric film 122, as described above. An adhesive 164 is then stencil printed over the central top surfaces 152 of the array of support pads 138. In another embodiment, the adhesive can be deposited on top of each support pad 138 using a dispensing needle. The pads of adhesive 164 form an array of adhesive pads which are coextensive with the array of support pads 138 so that the tops of all of the support pads 138 are covered by adhesive 164 . Next, the array of adhesive pads 164 undergo a curing process while in contact with the support pads 138 and the dielectric film 122 using the curing processes described above. The support pad/adhesive subassemblies may then be stored until required for assembling a microelectronic package. A storage liner (not shown) may be provided over the adhesive to make it easier to handle the subassembly and to avoid contamination of the adhesive layer 164. Preferably, the level of adhesion between the storage liner and the adhesive is lower than the level of adhesion between the dielectric film 122 and the support pads 138 so that the support pads 138 remain assembled to the dielectric film 122 as the storage liner is being removed. Moreover, the level of adhesion between the adhesive 164 and the support pads 138 should be greater than the level of adhesion between the liner and the adhesive 164 so that the adhesive 164 remains on the support pads 138 as the liner is being removed. A surface treatment, such as a synthetic fluorine containing resin sold under the trademark TEFLON® may be disposed between the storage liner and the adhesive 164 to reduce the level of tack therebetween.

When the support pad/adhesive subassembly is required for being assembled with a semiconductor chip or other microelectronic element, the subassembly is removed from storage and the support liner is removed to expose the adhesive 164. The front face of the semiconductor chip 120 is then assembled with the adhesive to form a microelectronic package. The adhesive/support pad subassembly is preferably aligned with the front face 124 of the semiconductor chip 120 so that no portion of the support pad/adhesive subassembly covers the contacts 126.

Figure 11:
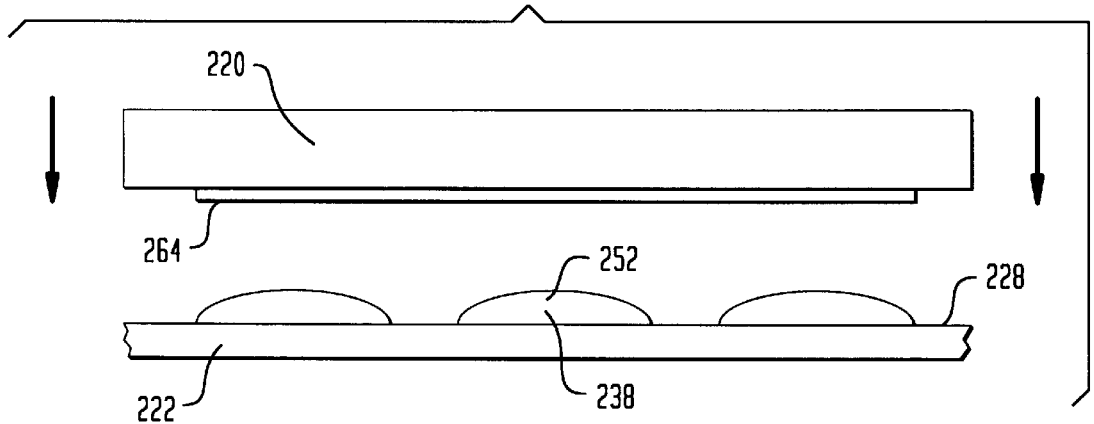
FIG. 11 shows the array of support pads shown in FIG. 3 including an adhesive sheet provided at the front face of a microelectronic element, according to another embodiment of the present invention.

FIG. 11 shows another embodiment whereby the adhesive 264 is provided at the front face of the semiconductor chip, rather than being provided over the support pads 238. In accordance with this embodiment, a mass of a curable liquid elastomer or epoxy is stencil printed onto a first surface 228 of a dielectric film 222 and a storage liner (not shown) is provided over the top central surface regions 252 of the support pads 238. A surface treatment, such as Teflon®, may be provided on the liner to reduce the level of tack between the support pads 238 and the liner. The storage liner makes it easier to handle the subassembly and avoid contamination of the support pads. The array of support pads 238 are then cured while in contact with the liner and the dielectric film 222, using the processes described above. The support pad/adhesive subassembly is then stored until it is required for assembling a microelectronic package. Prior to assembly, the liner is removed and the support pads are assembled with the front face of a semiconductor chip which includes an adhesive. The semiconductor chip package is then completed according to the processes described above.

As will be readily appreciated, numerous other variations and combinations of the features discussed above may be employed without departing from the present invention. For example, the support pads and adhesive pads may be printed by using ink jet printer technology to provide a large number of small support pads. In addition, the support pads and adhesive pads may be provided through a dispensing needle. Accordingly, the foregoing description of certain preferred embodiments should be taken by way of illustration, rather than by way of limitation, of the features discussed above.

What is claimed is:

1. A method of making a multiple part compliant interface for a microelectronic package comprising the steps of:
   providing a microelectronic element having electrically conductive parts;
   providing an array of curable elastomer support pads in contact with said microelectronic element;
   curing said curable elastomer support pads while said support pads remain in contact with said first microelectronic element;
   providing an array of adhesive pads in contact with said cured elastomer support pads, each said adhesive pad being disposed over and in substantial alignment with one of said support pads.

2. A method as claimed in claim 1, further comprising the step of providing a second microelectronic element having electrically conductive parts and assembling said second microelectronic element in contact with said adhesive pads.

3. A method as claimed in claim 2, further comprising the step of curing said adhesive pads.

4. A method as claimed in claim 3, wherein the assembling step includes the steps of:
   (a) abutting said second microelectronic element against said array of adhesive pads;
   (b) compressing said adhesive pads and said support pads between said microelectronic elements.

5. A method as claimed in claim 4, wherein said second microelectronic element is heated prior to the assembling step.

6. A method as claimed in claim 3, wherein the assembling step and the curing said adhesive element step occur simultaneously.

7. A method as claimed in claim 2, further including the step of electrically connecting said first and second microelectronic elements.

8. A method as claimed in claim 7, wherein the electrically connecting step further comprises the step of bonding the electrically conductive parts of said first and second microelectronic elements to one another to form electrical interconnections therebetween.

9. A method as claimed in claim 7, wherein said array of support pads define channels therebetween.

10. A method as claimed in claim 9, further comprising the steps of:
    disposing a curable elastomer encapsulant within said channels and between said microelectronic elements after the electrically connecting step;
    curing said curable elastomer encapsulant after the disposing step.

11. A method as claimed in claim 10, wherein said support pads and adhesive pads have substantially similar coefficients of thermal expansion.

12. A method as claimed in claim 10, wherein said support pads and said encapsulant have substantially similarly coefficients of thermal expansion.

13. A method as claimed in claim 10, wherein said support pads, said adhesive pads and said encapsulant comprise a silicone elastomer.

14. A method as claimed in claim 1, wherein the step of providing said array of curable elastomer support pads comprises the step of:
    providing a stencil having a plurality of holes therethrough atop said first microelectronic element;
    filling the holes in said stencil with a curable elastomer material;
    removing said stencil.

15. A method as claimed in claim 14, wherein the step of providing said array of curable elastomer support pads comprises the additional step of:
    allowing said array of curable elastomer support pads to flow after the removing said stencil step and before the curing step.

16. A method as claimed in claim 14, wherein the diameter of said holes in said stencil is between 400–500 microns.

17. A method as claimed in claim 14, wherein the thickness of said stencil is between 75–125 microns.

18. A method as claimed in claim 14, wherein the step of providing said array of adhesive pads comprises the steps of:
    providing a second stencil having a plurality of holes;
    aligning said second stencil over said support pads so that each said hole in said second stencil is in substantial alignment with one of said support pads;
    filling the holes in said second stencil with an adhesive;
    removing the second stencil.

19. A method as claimed in claim 18, wherein the diameter of each said hole in said second stencil is between 350–450 microns.

20. A method as claimed in claim 18, wherein said holes in said second stencil are smaller than said holes in said first stencil.

21. A method as claimed in claim 18, wherein the thickness of said second stencil is between 100–150 microns.

22. A method as claimed in claim 18, wherein after the removing the second stencil step the diameter of said adhesive pads remains substantially unchanged.

23. A method as claimed in claim 1, wherein said adhesive pads have greater viscosity than said support pads.

24. A method as claimed in claim 23, wherein said adhesive pads include a filler material.

25. A method as claimed in claim 24, wherein said filler material includes fumed silica.

26. A method as claimed in claim 2, wherein each said support pad includes a substantially dome-shaped top surface.

27. A method as claimed in claim 26, wherein before the assembling step each said adhesive pad includes a base which generally conforms to said substantially dome-shaped top surface of said support pad.

28. A method as claimed in claim 27, wherein after the assembling step the combination of each said support pad and said adhesive pad disposed thereover has a substantially column-like shape.

29. A method as claimed in claim 27, wherein after the assembling step the combined height of each said support pad and said adhesive pad disposed thereover is between 100–150 microns.

30. A method as claimed in claim 27, wherein after the assembling step the combined diameter of each said support pad and said adhesive pad disposed thereover between 500–600 microns.

31. A method as claimed in claim 1, wherein said first microelectronic element includes a flexible dielectric film.

32. A method as claimed in claim 1, wherein said second microelectronic element includes a semiconductor chip.

33. A method as claimed in claim 1, wherein said adhesive pads include pressure sensitive adhesive.

34. A method as claimed in claim 10, wherein the width of said channels is between 75–100 microns.

* * * * *

UNITED STATES PATENT AND TRADEMARK OFFICE
CERTIFICATE OF CORRECTION

PATENT NO. : 5,915,170
DATED : June 22, 1999
INVENTOR(S) : Raab et al.

It is certified that error appears in the above-indentified patent and that said Letters Patent is hereby corrected as shown below:

Column 8, line 18, "conform" should read --conforms--.

Column 12, line 22, "undergo" should read --undergoes--.

Column 14, line 2, "similarly" should read --similar--.

Column 15, line 1, after "thereover" insert --is--.

Signed and Sealed this

Twenty-third Day of November, 1999

Attest:

Q. TODD DICKINSON

*Attesting Officer*  *Acting Commissioner of Patents and Trademarks*